(12) United States Patent
Baik et al.

(10) Patent No.: US 10,340,908 B2
(45) Date of Patent: Jul. 2, 2019

(54) HALF-BRIDGE DRIVER FAULT DIAGNOSTIC SYSTEM AND METHOD

(71) Applicant: Continental Automotive Systems, Inc., Auburn Hills, MI (US)

(72) Inventors: Chung Heum Baik, Rochester Hills, MI (US); Jorge Gonzalez-Amaya, Lake Orion, MI (US); Mauricio Eduardo Hernandez-Distancia, Rochester Hills, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 347 days.

(21) Appl. No.: 15/218,989

(22) Filed: Jul. 25, 2016

(65) Prior Publication Data

US 2018/0026624 A1    Jan. 25, 2018

(51) Int. Cl.
*H02H 3/00* (2006.01)
*H03K 17/0812* (2006.01)
*G01R 31/02* (2006.01)
*H03K 17/687* (2006.01)

(52) U.S. Cl.
CPC ..... *H03K 17/08122* (2013.01); *G01R 31/025* (2013.01); *H03K 17/687* (2013.01)

(58) Field of Classification Search
USPC .......................................................... 361/42
See application file for complete search history.

(56) References Cited

U.S. PATENT DOCUMENTS

| 6,232,781 | B1 * | 5/2001 | Goser | F02D 41/221 |
| | | | | 324/415 |
| 2001/0048367 | A1 | 12/2001 | Wimmer et al. | |
| 2008/0319699 | A1 * | 12/2008 | Perryman | F02D 41/2096 |
| | | | | 702/115 |
| 2018/0026624 | A1 * | 1/2018 | Baik | H03K 17/08122 |
| | | | | 361/42 |

FOREIGN PATENT DOCUMENTS

CN        102721894 B    10/2014

OTHER PUBLICATIONS

Great Britain Intellectual Property Office Search Report for corresponding Britain application, GB1614525.2, dated Feb. 6, 2017.
International Search Report and Written Opinion of the International Searching Authority for counterpart PCT application PCT/US2017/043647, dated Nov. 14, 2017.

\* cited by examiner

*Primary Examiner* — Ronald W Leja

(57) ABSTRACT

An apparatus for controlling the application of electrical power to a load includes a controller, a controllable high side driver electrically connected to a first electrical terminal of the load, and a controllable low side driver electrically connected to a second electrical terminal of the load. The apparatus also includes a diagnostic circuit configured to sense and identify an open load fault condition, a high-side short circuit to battery fault condition, a low-side short circuit to ground fault condition, a high-side short circuit to ground fault condition, a low-side short circuit to battery fault condition, and a short circuited load fault condition. The diagnostic circuit is also configured to sense and identify a condition wherein none of the open load, high-side short circuit to battery, low-side short circuit to ground, high-side short circuit to ground, low-side short circuit to battery, and short circuited load fault conditions are present.

14 Claims, 2 Drawing Sheets

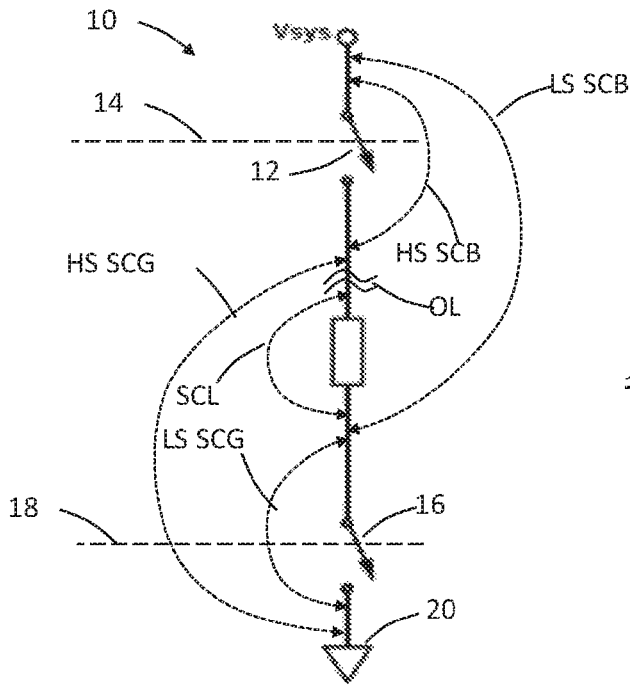

*FIG. 1*

| High-side on-state diagnostic circuit latched output (33a) | Low-side on-state diagnostic circuit latched output (33b) | OC detected before expiration of Ton_blank time? | High-side off-state diagnostic circuit (52a) | | | Low-side off-state diagnostic circuit (52b) | | | Fault detected |
|---|---|---|---|---|---|---|---|---|---|
| | | | V < VLVT | VLVT < V < VHVT | V > VHVT | V < VLVT | VLVT < V < VHVT | V > VHVT | |
| 0 | 0 | | | 1 | | | 1 | | No fault |
| 0 | 0 | | | | 1 | 1 | | | Open Load |
| 0 | 1 | no | | 1 | | | | | HS SCB |
| 0 | 1 | no | | | 1 | | | | HS SCB |
| 0 | 0 | | | | 1 | | | 1 | HS SCB |
| 1 | 0 | no | | | | | 1 | | LS SCG |
| 1 | 0 | no | | | | | 1 | | LS SCG |
| 0 | 0 | | 1 | | | | 1 | | LS SCG |
| 0 | 1 | yes | | 1 | | | | | LS SCB |
| 1 | 0 | yes | | | | | 1 | | HS SCG |
| 1 | 0 | no | | 1 | | | | 1 | SCL |
| 0 | 1 | no | | 1 | | | | 1 | SCL |
| 1 | 1 | no | | 1 | | | | 1 | SCL |
| 1 | 1 | yes | | | | | | | SCL |

HALF-BRIDGE DRIVER FAULT DIAGNOSTIC SYSTEM AND METHOD

FIELD OF THE INVENTION

The present invention relates to electronic power control systems, and more particularly to fault detection in an electronic controller providing power to an electrical load in a half-bridge configuration.

BACKGROUND OF THE INVENTION

The statements in this section merely provide background information related to the present disclosure and may or may not constitute prior art.

An electronic controller may be used to control electrical power supplied to an electrical load by controlling a switch connecting a first terminal of the load to a power source, in which case the switch is known as a high side switch or high side driver. A controller may also control power to a load by controlling a switch connecting a second terminal of the load to a ground connection, in which case the switch is known as a low side switch or low side driver. It may be desired to connect a load to both a high side driver and to a low side driver in a half bridge configuration, with the controller controlling both the high side driver and the low side driver. Fault detection schemes are desirable to recognize a fault condition (e.g. open circuit or short circuit) associated with the load, the high side driver, the low side driver, or interconnecting wiring. There is room in the art for improved fault detection schemes that exhibit improved performance and enable further design possibilities to improve cost, reliability, and performance.

BRIEF SUMMARY OF THE INVENTION

An apparatus for controlling the application of electrical power to a load is provided, the apparatus having a first electrical terminal and a second electrical terminal includes a controller and a high side driver electrically connected to a voltage supply and to the first electrical terminal of the load. The high side driver is controllable to an on state wherein current flow from the voltage supply to the load is enabled and to an off state wherein current flow from the voltage supply to the load is disabled. The apparatus also includes a low side driver electrically connected to the second electrical terminal of the load and to a ground connection. The low side driver is controllable to an on state wherein current flow from the load to the ground connection is enabled and to an off state wherein current flow from the load to the ground connection is disabled. The apparatus also includes a diagnostic circuit configured to sense a fault condition and to generate a signal indicative of the fault condition. More specifically, the diagnostic circuit is configured to sense and identify a first fault condition wherein the first fault condition is an open load fault condition, a second fault condition wherein the second fault condition is a high-side short circuit to battery fault condition, a third fault condition wherein the third fault condition is a low-side short circuit to ground fault condition, a fourth fault condition wherein the fourth fault condition is a high-side short circuit to ground fault condition, a fifth fault condition wherein the fifth fault condition is a low-side short circuit to battery fault condition, and a sixth fault condition wherein the sixth fault condition is a short circuited load fault condition. The diagnostic circuit is also configured to sense and identify a condition wherein none of the first fault condition, the second fault condition, the third fault condition, the fourth fault condition, the fifth fault condition, and the sixth fault condition are present.

In one embodiment of the present invention, upon sensing a fault condition that results in current through the high side driver, the low side driver, and/or the load exceeding a predetermined current threshold, a first control signal is sent to control the high side driver to its off state and a second control signal is sent to control the low side driver to its off state.

In another embodiment of the present invention, the fault condition that results in current through the high side driver, the low side driver, and/or the load exceeding a predetermined current threshold is the high-side short circuit to ground fault condition, the low-side short circuit to battery fault condition, or the short circuited load fault condition.

In yet another embodiment of the present invention, the diagnostic circuit includes a high-side on-state diagnostic circuit and a low-side on-state diagnostic circuit. The high-side on-state diagnostic circuit is configured to monitor a current through the high side driver from the voltage supply to the first electrical terminal of the load and to generate a high-side overcurrent logic signal indicative of whether the current through the high side driver is above or below a predetermined high-side current threshold. The low-side on-state diagnostic circuit is configured to monitor a current through the low side driver from the second electrical terminal of the load to the ground connection and to generate a low-side overcurrent logic signal indicative of whether the current through the low side driver is above or below a predetermined low-side current threshold. The apparatus further includes a first latch configured to capture the state of the high-side overcurrent logic signal and a second latch configured to capture the state of the low-side overcurrent logic signal.

BRIEF DESCRIPTION OF THE SEVERAL VIEWS OF THE DRAWING(S)

FIG. 1 is a depiction of a portion of a circuit for controlling power to an electrical load L with several possible faults identified, in accordance with the present invention;

FIG. 3 presents a table relating circuit outputs to detected faults in accordance with the present invention.

DETAILED DESCRIPTION OF THE INVENTION

Figure 2:
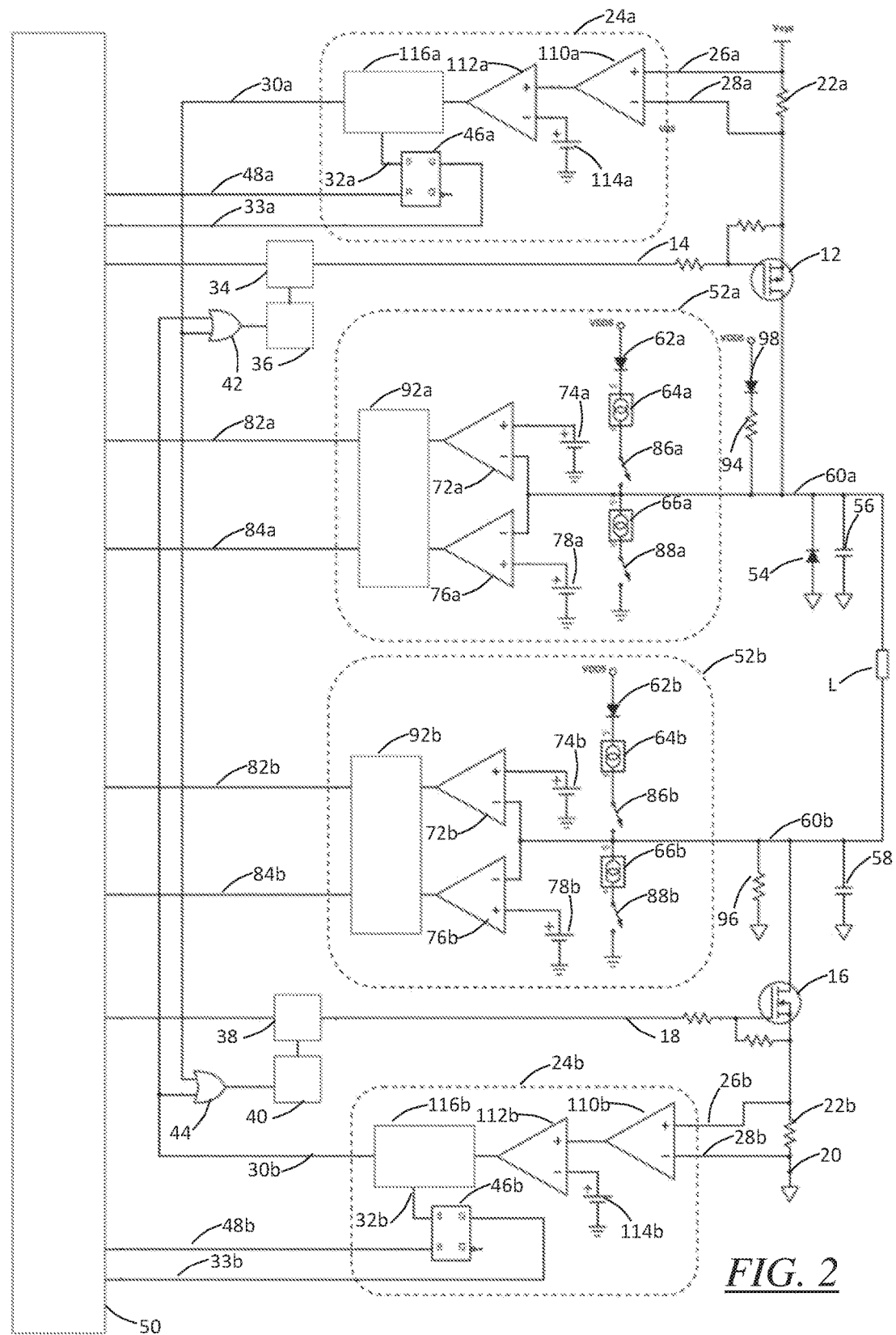
FIG. 2 depicts a non-limiting embodiment of a diagnostic circuit in accordance with the present invention.

When a system uses an electronic controller to control electrical power supplied to an electrical load, it may be required that certain fault conditions be recognized so that appropriate notification and/or reaction may take place. In a system where power is controlled utilizing both a high side driver and a low side driver, fault conditions may include open circuit or short circuit conditions associated with the load, the high side driver, the low side driver, or interconnecting wiring. Steps taken in reaction to a fault condition may include disabling power flow to the load in order to prevent undesirable actuation of the load and/or to protect switching devices from damage due to excessive internal power dissipation. Other reactive steps may alternatively or additionally include operation of the load at a reduced capacity, or activation of a backup system, in order to facilitate failsafe or "limp-home" operation. Availability of information related to fault conditions may additionally be required to satisfy regulatory requirements (e.g. OBD II). It may be preferred that fault detection is performed continuously during operation of the system, as opposed to only during dedicated diagnostic intervals such as at system power-up or power-down.

Referring now to the drawings, wherein the showings are for the purpose of illustrating certain exemplary embodiments only and not for the purpose of limiting the same, FIG. 1 is a depiction of a portion of a circuit 10 for controlling power to an electrical load L. The electrical load L may be a resistive load or may represent an impedance having a resistive component and an inductive or capacitive component. The circuit 10 includes a high side driver 12 electrically connected between a power source Vsys and the load L. Conduction through the high side driver 12 is controlled by a control input 14, such that the driver 12 is placed in either a conducting state or a non-conducting state based upon a level of a signal at control input 14. The circuit 10 further includes a low side driver 16 electrically connected between the load L and a ground potential 20. Conduction through the low side driver 16 is controlled by a control input 18, such that the driver 16 is placed in either a conducting state or a non-conducting state based upon a level of a signal at control input 18. The terms "high side" and "low side" are used merely for the convenience of identifying the drivers 12 and 16, and are not intended to limit the invention to circuits having a particular polarity for the power source Vsys.

While referred to as switches, the high side driver 12 and/or the low side driver 16 may be a component having non-ideal switching characteristics, e.g. leakage conductance in the non-conducting state, non-zero impedance in the conducting state, non-zero switching time, and/or significant impedance while transitioning between the conducting state and the non-conducting state. In an advantageous embodiment, the high side driver 12 and the low side driver 16 comprise MOSFET transistors.

FIG. 1 further illustrates six distinct fault conditions that can possibly occur; an open load fault condition OL, a high-side short-circuit-to-battery fault HS SCB, a low-side short-circuit-to-ground fault LS SCG, a low-side short-circuit-to battery condition LS SCB, a high-side short circuit to ground labeled HS SCG, and a short circuit across the load SCL. The open load fault condition OL is an interruption in the conductive path that normally exists through the load L between the high side driver 12 and the low side driver 16. The open load OL fault may be the result of an open circuit in the load L itself or the result of an interruption in any of the interconnection wiring between the high side driver 12 and the load L or between the low side driver 16 and the load L. The high-side short-circuit-to-battery fault HS SCB is a short circuit across the high side driver 12 from the power source Vsys to the node interconnecting the high side driver 12 and the load L. The low-side short-circuit-to-ground fault LS SCG is a short circuit across the low side driver 16 from the ground potential 20 to the node interconnecting the load L and the low side driver 16. The low-side short-circuit-to battery condition LS SCB is a short circuit across the series combination of the high side driver 12 and the load L. The high-side short circuit to ground HS SCG is a short circuit across the series combination of the load L and the low side driver 16. The short circuit across the load SCL if gone unrecognized will result in excess current flowing through the high side driver 12 and the low side driver 16 when the drivers 12, 16 are in the conducting state. This abnormally high current may cause damage to or destruction of the high side driver 12 and the low side driver 16 if they are not rated to handle the excess current level.

The term "battery" in the naming of the HS SCB and LS SCB faults is not intended to limit the invention to circuits in which Vsys is derived from a battery; rather, Vsys can be any AC or DC source appropriate for supplying power to the load L. The term "ground" in the naming of the LS SCG and HS SCG faults is not intended to limit the invention to circuits in which the node 20 is at or near earth potential; rather node 20 can be at any voltage difference from Vsys appropriate for supplying power to the load L.

It may be desired that the load is not continuously energized during operation of the system, but rather that power is applied to the load in a cyclic fashion with the high side driver 12 and the low side driver 16 in a conducting state for a first portion of each cycle and in a non-conducting state for a second portion of each cycle. Having both a high side driver 12 and a low side driver 16 in series with the load L also allows for operation wherein a first one of the drivers, for example the low side driver 16, is placed in an "on" (conducting) state for a first portion of each cycle and in an "off" (non-conducting) state for a second portion of each cycle, while the other one of the drivers is switched several times between a conducting state and a non-conducting state during the first portion of the cycle when the first one of the drivers is in a conducting state. Total power to the load is related to the duty cycle, defined as the ratio of the portion of time within a cycle when both the high side driver 12 and the low side driver 16 are conducting to the total cycle time. Initiation and duration of each cycle may be event based, for example related to the occurrence of a system event such as fuel injection into an internal combustion engine. Alternatively, each cycle may be time based, with each cycle having a predetermined duration. According to an aspect of the present invention, fault diagnostics of a system in which the load L is energized in a cyclic fashion involves performing some diagnostic tests while the drivers 12, 16 are in a conducting state and performing other diagnostic tests while the drivers 12, 16 are in a non-conducting state. Information involving different fault states may be available at different points in time during the cycle, and provision is made to combine this information to provide specific fault identification.

A non-limiting embodiment of a diagnostic circuit incorporating aspects of the present invention is depicted in FIG. 2. FIG. 2 depicts the load L, the high side driver 12, and the low side driver 16. The high side driver 12 is illustrated as a MOSFET device whose control input 14 is provided by a high side gate drive circuit 34 based on a commanded high side driver state communicated to the high side gate drive circuit 34 by a control logic 50. A high side gate shutoff circuit 36 is provided, the high side gate shutoff circuit 36 being capable of overriding the commanded high side driver state to force the high side gate drive circuit 34 to urge the high side driver 12 to its non-conducting state. Similarly, the low side driver 16 is depicted as a MOSFET device having a control input 18 provided by a low side gate drive circuit 38 based on a commanded low side driver state communicated to the low side gate drive circuit 38 by the control logic 50. A low side gate shutoff circuit 40 is provided, the low side gate shutoff circuit 40 being capable of overriding the commanded low side driver state to force the gate drive circuit 38 to urge the low side driver 16 to its non-conducting state.

FIG. 2 also depicts a node 60a which represents the voltage at the first electrical terminal of the load L, and a second node 60b which represents the voltage a the second electrical terminal of the load L. A freewheeling diode 54 and a first capacitor 56 are shown each connected from node 60*a* to ground, and a second capacitor 58 is shown connected from node 60*b* to ground.

FIG. 2 additionally depicts a pull-up resistor 94 connected to a voltage source VDD5 through a diode 98 and to node 60*a* at the first terminal of the load L, and a pull-down resistor 96 connected to the node 60*b* at the second terminal of the load L. The node 60*a* is an input to a high-side off-state diagnostic circuit 52*a*, and the node 60*b* is an input to a low-side off-state diagnostic circuit 52*b*. In an embodiment of the invention, the voltage source VDD5 is set to 5 volts, the pull-up resistor 94 has a resistance of 10 kilohms, the pull-down resistor 96 has a resistance of 12 kilohms, and the load has a resistance of less than 10 ohms. Using these example resistance values, with the high side driver 12 and the low side driver 16 both turned off, i.e. both non-conducting, and with no current into or out of the high-side off-state diagnostic circuit 52*a* and the low-side off-state diagnostic circuit 52*b*, the voltage at node 60*a* and the voltage at node 60*b* will both be approximately 2.5 volts. In the event of an open load (OL) fault condition, when the high side driver 12 and the low side driver 16 are turned off the voltage at the node 60*a* will be pulled up to approximately 5 volts and the voltage at the node 60*b* will be pulled down to ground. The pull-up resistor 94 and the pull-down resistor 96 thus provide a means for detecting an open load fault condition.

With continued reference to FIG. 2, a first shunt resistor 22*a* is connected between the power source Vsys and the high side driver 12. Under normal operation the current through the first shunt resistor 22*a* is essentially the same as the current through the load L, so that the voltage drop across the first shunt resistor 22*a* serves as an indication of the load current L. The voltage at one terminal of the shunt resistor 22*a* is a first input 26*a* to a high-side on-state fault diagnostic circuit 24*a*, and the voltage at the other terminal of the first shunt resistor 22*a* is a second input 28*a* to the high-side on-state fault diagnostic circuit 24*a*. The voltage drop across the first shunt resistor 22*a* is amplified by a gain amplifier 110*a*. The output of the gain amplifier 110*a* is provided to a first input of a comparator 112*a*. A second input of the comparator 112*a* is provided by a reference voltage source 114*a*. The output of the comparator 112*a* will be in a first logic state if the current through the shunt resistor 22*a* is below an overcurrent threshold value determined by the resistance value of the shunt resistor 22*a*, the gain of the gain amplifier 110*a*, and the reference voltage provided by the reference voltage source 114*a*. The output of the comparator 112*a* will be in a second logic state if the current through the shunt resistor 22*a* is above the overcurrent threshold value. The output of the comparator 112*a* is provided to a blanking and filtering circuit 116*a*. The blanking and filtering circuit 116*a* is configured to suppress indication of an overcurrent fault for a specified time interval Ton_blank following a command for the high side driver 12 and the low side driver 16 to turn on, so as to prevent false indication of an error condition due to normal response times associated with switching on the current through the load L. A non-limiting exemplary value for Ton_blank is approximately 20 microseconds. The blanking and filtering circuit 116*a* is also configured to require a sensed fault to be present for at least a specified time interval Ton_filter before the sensed fault is recognized, to prevent false indication of a fault due to noise on the overcurrent signal.

The exemplary blanking and filtering circuit 116*a* provides a first output 30*a* and a second output 32*a*. The first output 30*a* and the second output 32*a* will each be in a first logic state if the current through the shunt resistor 22*a* is below the overcurrent threshold value, and will each be in a second logic state if the current through the shunt resistor 22*a* is above the overcurrent threshold value. The second output 32*a* of the high-side on-state diagnostic circuit 24*a* is provided as an input to a first latch circuit 46*a*, depicted as an SR latch. When an overcurrent fault condition is detected by the high-side on-state diagnostic circuit 24*a*, the fault condition is stored by the latch circuit 46*a* even after the overcurrent fault condition is no longer present, for example after current flow through the drivers 12, 16 is interrupted. The Q output 33*a* of the first SR latch 46*a* is provided as an input to the controller 50. The controller 50 is also configured to generate a reset signal 48*a* provided to the R input of the first latch circuit 46*a*. In an advantageous embodiment, the reset signal 48*a* is a pulse that is transmitted when the low side driver 16 is switched from its off state to its on state.

With continued reference to FIG. 2, a second shunt resistor 22*b* is connected between the low side driver 16 and the ground connection 20. The current through the second shunt resistor 22*b* under normal operation is essentially the same as the current through the load L, so that the voltage drop across the second shunt resistor 22*b* serves as an indication of the load current L. The voltage at one terminal of the second shunt resistor 22*b* is a first input 26*b* to a low-side on-state fault diagnostic circuit 24*b*, and the voltage at the other terminal of the second shunt resistor 22*b* is a second input 28*b* to the low-side on-state fault diagnostic circuit 24*b*. The voltage drop across the shunt resistor that appears at the first input 26*b* and the second input 28*b* of the fault diagnostic circuit 24*b* is amplified by a gain amplifier 110*b*. The output of the gain amplifier 110*b* is provided to a first input of a comparator 112*b*. A second input of the comparator 112*b* is provided by a reference voltage source 114*b*. The output of the comparator 112*b* will be in a first logic state if the current through the shunt resistor 22*b* is below an overcurrent threshold value determined by the resistance value of the shunt resistor 22*b*, the gain of the gain amplifier 110*b*, and the reference voltage provided by the reference voltage source 114*b*. The output of the comparator 112*b* will be in a second logic state if the current through the shunt resistor 22*b* is above the overcurrent threshold value. The output of the comparator 112*b* is input to a blanking and filtering circuit 116*b*. The blanking and filtering circuit 116*b* is configured to suppress indication of an overcurrent fault for a specified time interval Ton_blank following a command for the high side driver 12 and the low side driver 16 to turn on, so as to prevent false indication of an error condition due to normal response times associated with switching on the current through the load L. A non-limiting exemplary value for Ton_blank is approximately 20 microseconds. The blanking and filtering circuit 116*b* is also configured to require a sensed fault to be present for at least a specified time interval Ton_filter before the sensed fault is recognized, to prevent false indication of a fault due to noise on the overcurrent signal.

The exemplary blanking and filtering circuit 116*b* provides a first output 30*b* and a second output 32*b*. The first output 30*b* and the second output 32*b* will each be in a first logic state if the current through the shunt resistor 22*b* is below the overcurrent threshold value, and will each be in a second logic state if the current through the shunt resistor 22*b* is above the overcurrent threshold value. The second output 32*b* of the low-side on-state diagnostic circuit 24*b* is provided as an input to a second latch circuit 46*b*. The second latch circuit 46b is depicted as an SR latch. When an overcurrent fault condition is detected by the low-side on-state diagnostic circuit 24b, the fault condition is stored by the latch circuit 46b even after the overcurrent fault condition is no longer present, for example after current flow through the drivers 12, 16 is interrupted. The Q output 33b of the second SR latch 46b is provided as an input to the controller 50. The controller 50 is also configured to generate a reset signal 48b provided to the R input of the second latch circuit 46b to reset the latch circuits. In an advantageous embodiment, the reset signal 48b is a pulse that is transmitted when the low side driver 16 is switched from its off state to its on state.

An overcurrent fault may be the result of a short circuit to battery (SCB) condition, a short circuit to ground (SCG) fault condition, or a short circuited load (SCL) fault condition. Regardless of the root cause of an overcurrent fault, it is desirable to immediately disable current flow through the high side driver 12 and the low side driver 16 upon recognition of an overcurrent fault, to prevent damage to the drivers 12, 16 due to excess current and/or excess power dissipation in the drivers 12, 16. The circuit shown in FIG. 2 includes a first OR gate 42 having two inputs, the first input being the output 30a from the high-side on-state diagnostic circuit 24a and the second input being the output 30b from the low-side on-state diagnostic circuit 24b. The output of the first OR gate 42 is provided as an input to the high side gate shutoff circuit 36. The circuit shown in FIG. 2 also includes a second OR gate 44 having two inputs, the first input being the output 30a from the high-side on-state diagnostic circuit 24a and the second input being the output 30b from the low-side on-state diagnostic circuit 24b. The output of the second OR gate 44 is provided as an input to the low side gate shutoff circuit 40. Thus, the circuit of FIG. 2 is configured to turn off both the high side driver 12 and the low side driver 16 upon detection of an overcurrent condition at either the high side shunt resistor 22a or the low side shunt resistor 22b.

In the preceding description the input voltage of the high-side on-state diagnostic circuit 24a, i.e. the voltage difference between node 26a and node 28a, was the voltage drop across the shunt resistor 22a. In an alternate embodiment, the input voltage of the high-side on-state diagnostic circuit 24a could be the drain-to-source voltage of the high side driver 12. Similarly, the input voltage of the low-side on-state diagnostic circuit 24b, i.e. the voltage difference between node 26b and node 28b, was the voltage drop across the shunt resistor 22b. In an alternate embodiment, the input voltage of the low-side on-state diagnostic circuit 24b could be the drain-to-source voltage of the low side driver 16.

In addition to the high-side on-state diagnostic circuit 24a and the low-side on-state diagnostic circuit 24b, FIG. 2 also includes a high-side off-state diagnostic circuit 52a and a low-side off-state diagnostic circuit 52b.

The high-side off-state fault diagnostic circuit 52a includes a first current source 64a connected to a voltage source VDD5 through a diode 62a and connectable to the input terminal 60a through a switch 86a. In the non-limiting exemplary embodiment shown in FIG. 2, the voltage source VDD5 is nominally 5 volts, and the diode 62a prevents current flow from the input terminal 60a to the voltage source VDD5 when the voltage at terminal 60a is above 5 volts, for example when the load L is energized. The off-state fault diagnostic circuit 52a further includes a second current source 66a connected to the input terminal 60a and connectable to ground through a switch 88a. Operation of the switches 86a and 88a is controlled by the controller 50.

The high-side off-state diagnostic circuit 52a also includes a first comparator 72a having as a first input a first reference voltage source 74a and as a second input the voltage at the input terminal 60a. The diagnostic circuit 52a also includes a second comparator 76a having as a first input a second reference voltage source 78a and as a second input the voltage at the input terminal 60a. In an advantageous embodiment the first reference voltage source 74a is set to a high voltage threshold voltage VHVT that is greater than the nominal voltage set by the voltage divider comprising the pull-up resistor 94 and the pull-down resistor 96, while the second reference voltage source 78a is set to a low voltage threshold voltage VLVT that is less than the nominal voltage set by the voltage divider comprising the pull-up resistor 94 and the pull-down resistor 96.

In operation, the switch 86a in the high-side off-state diagnostic circuit 52a can be controlled to selectively connect the current source 64a in the high-side off-state diagnostic circuit 52a to the capacitor 56 connected to the input terminal 60a to charge the capacitor 56, and the switch 88a in the high-side off-state diagnostic circuit 52a can be controlled to selectively connect the current source 66a in the high-side off-state diagnostic circuit 52a to the capacitor 56 to discharge the capacitor 56. While the capacitor 56 is charged and discharged, the voltage level at the input terminal 60a is monitored by the comparators 72a and 76a in the high-side off-state diagnostic circuit 52a. The output of the comparator 72a and the output of the comparator 76a are input to a blanking and filtering circuit 92a. The blanking and filtering circuit 92a is configured for a specified time interval Toff_blank following a command for the high side driver 12 to turn off, so as to prevent false indication of an error condition due to normal response times associated with switching off the current through the load L. A non-limiting exemplary value for Toff_blank is approximately 1 millisecond. The blanking and filtering circuit 92a is also configured to require a sensed fault to be present for at least a specified time interval Toff_filter before the sensed fault is recognized, to prevent false indication of a fault due to noise on the signal. The exemplary blanking and filtering circuit 92a provides a first output 82a which is based on the output of the comparator 72a, and a second output 84a which is based on the output of the comparator 76a.

As described above, outputs of the high-side off-state diagnostic circuit 52a, i.e. the output of the first comparator 72a and the output of the second comparator 76a, can be used to ascertain which one of three conditions exists, the three conditions being: (1) the voltage at terminal 60a is less than VLVT; (2) the voltage at terminal 60a is greater than VLVT and less than VHVT; and (3) the voltage at terminal 60a is greater than VHVT.

The low-side off-state fault diagnostic circuit 52b includes a first current source 64b connected to a voltage source VDD5 through a diode 62b and connectable to the input terminal 60b through a switch 86b. In the non-limiting exemplary embodiment shown in FIG. 2, the voltage source VDD5 is nominally 5 volts, and the diode 62b prevents current flow from the input terminal 60b to the voltage source VDD5 when the voltage at terminal 60b is above 5 volts, for example in the event of a low-side short circuit to battery condition. The off-state fault diagnostic circuit 52b further includes a second current source 66b connected to the input terminal 60b and connectable to ground through a switch 88b. Operation of the switches 86b and 88b is controlled by the controller 50.

The low-side off-state diagnostic circuit 52b also includes a first comparator 72b having as a first input a first reference voltage source 74b and as a second input the voltage at the input terminal 60b. The diagnostic circuit 52b also includes a second comparator 76b having as a first input a second reference voltage source 78b and as a second input the voltage at the input terminal 60b. In an advantageous embodiment the first reference voltage source 74b is set to a high voltage threshold voltage VHVT that is greater than the nominal voltage set by the voltage divider comprising the pull-up resistor 94 and the pull-down resistor 96, while the second reference voltage source 78b is set to a low voltage threshold voltage VLVT that is less than the nominal voltage set by the voltage divider comprising the pull-up resistor 94 and the pull-down resistor 96.

In operation, the switch 86b in the low-side off-state diagnostic circuit 52b can be controlled to selectively connect the current source 64b in the low-side off-state diagnostic circuit 52b to the capacitor 58 connected to the input terminal 60b to charge the capacitor 58, and the switch 88b in the low-side off-state diagnostic circuit 52b can be controlled to selectively connect the current source 66b in the low-side off-state diagnostic circuit 52b to the capacitor 58 to discharge the capacitor 58. While the capacitor 58 is charged and discharged, the voltage level at the input terminal 60b is monitored by the comparators 72b and 76b in the low-side off-state diagnostic circuit 52b. The output of the comparator 72b and the output of the comparator 76b are input to a blanking and filtering circuit 92b. The blanking and filtering circuit 92b is configured for a specified time interval Toff_blank following a command for the low side driver 16 to turn off, so as to prevent false indication of an error condition due to normal response times associated with switching off the current through the load L. A non-limiting exemplary value for Toff_blank is approximately 1 millisecond. The blanking and filtering circuit 92b is also configured to require a sensed fault to be present for at least a specified time interval Toff_filter before the sensed fault is recognized, to prevent false indication of a fault due to noise on the signal. The exemplary blanking and filtering circuit 92b provides a first output 82b which is based on the output of the comparator 72b, and a second output 84b which is based on the output of the comparator 76b.

As described above, outputs of the low-side off-state diagnostic circuit 52b, i.e. the output of the first comparator 72b and the output of the second comparator 76b, can be used to ascertain which one of three conditions exists, the three conditions being: (1) the voltage at terminal 60b is less than VLVT; (2) the voltage at terminal 60b is greater than VLVT and less than VHVT; and (3) the voltage at terminal 60b is greater than VHVT.

The various combinations of possible logic state outputs of the diagnostic circuits described above, as well as the fault conditions indicated by each combination, can be summarized in a table presented as FIG. 3. In the table in FIG. 3, the identifiers 33a, 33b, 52a, and 52b associated with the diagnostic circuits refer to the designations indicated in FIG. 2. A "1" associated with the high-side on-state diagnostic circuit latched output 33a or the low-side on-state diagnostic circuit latched output 33b indicates that an overcurrent condition was detected by the respective on-state diagnostic circuit during the on state of the high side driver 12 and the low side driver 16. A "0" associated with the high-side on-state diagnostic circuit latched output 33a or the low-side on-state diagnostic circuit latched output 33b indicates that no overcurrent condition was detected by the respective on-state diagnostic circuit during the on state of the high side driver 12 and the low side driver 16.

With continued reference to FIG. 3, the table includes a column labeled "OC detected before expiration of Ton_blank time?", with a "yes" or "no" entry for each row associated with an overcurrent (OC) detection on the high-side on-state diagnostic circuit latched output 33a or the low-side on-state diagnostic circuit latched output 33b. A "yes" entry indicates that the overcurrent condition is detected before Ton_blank time expires, which may occur in the event of a LS SCB (low-side short-circuit-to-battery) fault, a HS SCG (high-side short-circuit-to-ground) fault, or a SCL (short-circuited load) fault.

The table in FIG. 3 also includes three columns under the heading "High-side off-state diagnostic circuit (52a)", and three columns under the heading "Low-side off-state diagnostic circuit (52b)". As previously discussed, the outputs of each of the high-side off-state diagnostic circuit 52a and the low side off-state diagnostic circuit 52b can be used to determine whether the respective input voltage 60a, 60b is less than the low voltage threshold VLVT, between the low voltage threshold VLVT and the high voltage threshold VHVT, or above the high voltage threshold VHVT. A "1" in a table cell in the three columns under the heading "High-side off-state diagnostic circuit (52a)", and three columns under the heading "Low-side off-state diagnostic circuit (52b)" indicates the level of the respective voltage 60a, 60b.

As illustrated in the table in FIG. 3, the logic signals generated by the diagnostic circuit in FIG. 2 can be used to pinpoint which, if any, of the six possible fault conditions illustrated and discussed with respect to FIG. 1 is present. In an advantageous embodiment, the controller 50 responds to an indicated fault condition is a manner appropriate for the particular fault condition, which may vary depending on the particular fault condition identified. Responses by the controller 50 may include, but are not limited to, storing a diagnostic code, illuminating an indicator lamp, or operating the load at a reduced capacity to provide a failsafe or limp-home function.

The controller 50, as described above, can be a single device or a number of devices. Control module, module, controller, control unit, control logic, processor and similar terms mean any suitable one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs, combinational logic circuit(s), input/output circuit(s) and devices, appropriate signal conditioning and buffer circuitry, and other suitable components to provide the described functionality. The controller 50 has a set of control algorithms, including resident software program instructions and calibrations stored in memory and executed to provide the desired functions. The algorithms are preferably executed during preset loop cycles. Algorithms are executed, such as by a central processing unit, and are operable to monitor inputs from sensing devices and other networked control modules, and execute control and diagnostic routines to control operation of actuators. Loop cycles may be executed at regular time intervals during ongoing engine and vehicle operation. Alternatively, algorithms may be executed in response to occurrence of an event.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The following is claimed:

1. An apparatus for controlling the application of electrical power to a load having a first electrical terminal and a second electrical terminal, the apparatus comprising:
   a controller;
   a high side driver electrically connected to a voltage supply and to the first electrical terminal of the load, the high side driver controllable to an on state wherein current flow from the voltage supply to the load is enabled and to an off state wherein current flow from the voltage supply to the load is disabled;
   a low side driver electrically connected to the second electrical terminal of the load and to a ground connection, the low side driver controllable to an on state wherein current flow from the load to the ground connection is enabled and to an off state wherein current flow from the load to the ground connection is disabled;
   a diagnostic circuit configured to sense a fault condition and to generate a signal indicative of the fault condition;
   wherein the diagnostic circuit is configured to sense and identify a first fault condition wherein the first fault condition is an open load fault condition;
   wherein the diagnostic circuit is configured to sense and identify a second fault condition wherein the second fault condition is a high-side short circuit to battery fault condition;
   wherein the diagnostic circuit is configured to sense and identify a third fault condition wherein the third fault condition is a low-side short circuit to ground fault condition;
   wherein the diagnostic circuit is configured to sense and identify a fourth fault condition wherein the fourth fault condition is a high-side short circuit to ground fault condition;
   wherein the diagnostic circuit is configured to sense and identify a fifth fault condition wherein the fifth fault condition is a low-side short circuit to battery fault condition;
   wherein the diagnostic circuit is configured to sense and identify a sixth fault condition wherein the sixth fault condition is a short circuited load fault condition;
   wherein the diagnostic circuit is configured to sense and identify a condition wherein none of the first fault condition, the second fault condition, the third fault condition, the fourth fault condition, the fifth fault condition, and the sixth fault condition are present,
   wherein the diagnostic circuit comprises a high-side on-state diagnostic circuit and a low-side on-state diagnostic circuit;
   wherein the high-side on-state diagnostic circuit is configured to monitor a current through the high side driver from the voltage supply to the first electrical terminal of the load and to generate a high-side overcurrent logic signal indicative of whether the current through the high side driver is above or below a predetermined high-side current threshold;
   wherein the low-side on-state diagnostic circuit is configured to monitor a current through the low side driver from the second electrical terminal of the load to the ground connection and to generate a low-side overcurrent logic signal indicative of whether the current through the low side driver is above or below a predetermined low-side current threshold;
   the apparatus further including a first latch configured to capture the state of the high-side overcurrent logic signal and a second latch configured to capture the state of the low-side overcurrent logic signal.

2. The apparatus of claim 1 wherein, upon sensing a fault condition that results in current through the high side driver, the low side driver, and/or the load exceeding a predetermined current threshold, a first control signal is sent to control the high side driver to its off state and a second control signal is sent to control the low side driver to its off state.

3. The apparatus of claim 2 wherein the fault condition that results in current through the high side driver, the low side driver, and/or the load exceeding the predetermined current threshold is the high-side short circuit to ground fault condition, the low-side short circuit to battery fault condition, or the short circuited load fault condition.

4. The apparatus of claim 1, wherein the diagnostic circuit further comprises a high-side off-state diagnostic circuit and a low-side off-state diagnostic circuit;
   wherein the high-side off-state diagnostic circuit comprises at least one current source configured to be connectable to the first electrical terminal of the load so as to be able to charge and/or discharge a first capacitor connected from the first electrical terminal of the load to the ground connection, and a high-side voltage comparison means configured to indicate whether the voltage at the first electrical terminal of the load is less than a high-side low voltage threshold, between the high-side low voltage threshold and a high-side high voltage threshold, or above the high-side high voltage threshold, wherein the high-side high voltage threshold is a higher voltage than the high-side low voltage threshold;
   wherein the low-side off-state diagnostic circuit comprises at least one current source configured to be connectable to the second electrical terminal of the load so as to be able to charge and/or discharge a second capacitor connected from the second electrical terminal of the load to the ground connection, and a low-side voltage comparison means configured to indicate whether the voltage at the second electrical terminal of the load is less than a low-side low voltage threshold, between the low-side low voltage threshold and a low-side high voltage threshold, or above the low-side high voltage threshold, wherein the low-side high voltage threshold is a higher voltage than the low-side low voltage threshold.

5. The apparatus of claim 4 further comprising a pull-up resistor connected between a reference voltage source and the first electrical terminal of the load, and a pull-down resistor connected between the second electrical terminal of the load and ground.

6. The apparatus of claim 5 wherein the resistance values of the pull-up resistor and the pull-down resistor are preselected such that when the high side driver and the low side driver are both controlled to their respective off states the voltage at the first electrical terminal of the load is between the high-side low voltage threshold and the high-side high voltage threshold and the voltage at the second electrical terminal of the load is between the low-side low voltage threshold and the low-side high voltage threshold when the short circuited load condition is not present.

7. The apparatus of claim 6 wherein the diagnostic circuit is configured to sense and identify the first fault condition, the second fault condition, the third fault condition, the fourth fault condition, the fifth fault condition, and the sixth fault condition based on the high-side overcurrent logic signal, the low-side overcurrent logic signal, a signal from the high-side voltage comparison means, and a signal from the low-side voltage comparison means.

8. A method of diagnosing faults in an apparatus for controlling the application of electrical power to a load having a first electrical terminal and a second electrical terminal, the apparatus comprising:
   a controller;
   a high side driver electrically connected to a voltage supply and to the first electrical terminal of the load, the high side driver controllable to an on state wherein current flow from the voltage supply to the load is enabled and to an off state wherein current flow from the voltage supply to the load is disabled;
   a low side driver electrically connected to the second electrical terminal of the load and to a ground connection, the low side driver controllable to an on state wherein current flow from the load to the ground connection is enabled and to an off state wherein current flow from the load to the ground connection is disabled; and
   a diagnostic circuit configured to sense a fault condition and to generate a signal indicative of the fault condition;
   the method comprising the steps of:
   sensing and identifying an open load fault condition when the open load fault condition is present;
   sensing and identifying a high-side short circuit to battery fault condition when the high-side short circuit to battery fault condition is present;
   sensing and identifying a low-side short circuit to ground fault condition when the low-side short circuit to ground fault condition is present;
   sensing and identifying a high-side short circuit to ground fault condition when the high-side short circuit to ground fault condition is present;
   sensing and identifying a low-side short circuit to battery fault condition when is present;
   sensing and identifying a short circuited load fault condition when is present;
   indicating a "no fault" condition when none of the open load fault condition, the high-side short circuit to battery fault condition, the low-side short circuit to ground fault condition, the high-side short circuit to ground fault condition, the low-side short circuit to battery fault condition, and the short circuited load fault condition are present,
   monitoring a current through the high side driver from the voltage supply to the first electrical terminal of the load and generating a high-side overcurrent logic signal indicative of whether the current through the high side driver is above or below a predetermined high-side current threshold;
   monitoring a current through the low side driver from the second electrical terminal of the load to the ground connection and generating a low-side overcurrent logic signal indicative of whether the current through the low side driver is above or below a predetermined low-side current threshold;
   providing a first latch configured to capture the state of the high-side overcurrent logic signal; and
   providing a second latch configured to capture the state of the low-side overcurrent logic signal.

9. The method of claim 8 further comprising the steps of:
   sensing if a fault condition results in current through the high side driver, the low side driver, and/or the load exceeding a predetermined current threshold, and
   sending a first control signal to control the high side driver to its off state and a second control signal to control the low side driver to its off state when a fault condition that results in current through the high side driver, the low side driver, and/or the load exceeding a predetermined current threshold is sensed.

10. The method of claim 9 wherein the fault condition that results in current through the high side driver, the low side driver, and/or the load exceeding the predetermined current threshold being sensed is the high-side short circuit to ground fault condition, the low-side short circuit to battery fault condition, or the short circuited load fault condition.

11. The method of claim 8, further comprising the steps of:
   providing at least one current source configured to be connectable to the first electrical terminal of the load so as to be able to charge and/or discharge a first capacitor connected from the first electrical terminal of the load to the ground connection,
   providing a high-side voltage comparison means configured to indicate whether the voltage at the first electrical terminal of the load is less than a high-side low voltage threshold, between the high-side low voltage threshold and a high-side high voltage threshold, or above the high-side high voltage threshold, wherein the high-side high voltage threshold is a higher voltage than the high-side low voltage threshold,
   providing at least one current source configured to be connectable to the second electrical terminal of the load so as to be able to charge and/or discharge a second capacitor connected from the second electrical terminal of the load to the ground connection, and
   providing a low-side voltage comparison means configured to indicate whether the voltage at the second electrical terminal of the load is less than a low-side low voltage threshold, between the low-side low voltage threshold and a low-side high voltage threshold, or above the low-side high voltage threshold, wherein the low-side high voltage threshold is a higher voltage than the low-side low voltage threshold.

12. The method of claim 11, further comprising the steps of:
   providing a pull-up resistor connected between a reference voltage source and the first electrical terminal of the load, and
   providing a pull-down resistor connected between the second electrical terminal of the load and ground.

13. The method of claim 12 further comprising the step of preselecting the resistance values of the pull-up resistor and the pull-down resistor such that when the high side driver and the low side driver are both controlled to their respective off states the voltage at the first electrical terminal of the load is between the high-side low voltage threshold and the high-side high voltage threshold and the voltage at the second electrical terminal of the load is between the low-side low voltage threshold and the low-side high voltage threshold when the short circuited load condition is not present.

14. The method of claim 13 wherein the steps of:
   sensing and identifying an open load fault condition when the open load fault condition is present, sensing and identifying a high-side short circuit to battery fault condition when the high-side short circuit to battery fault condition is present,
sensing and identifying a low-side short circuit to ground fault condition when the low-side short circuit to ground fault condition is present,
sensing and identifying a high-side short circuit to ground fault condition when the high-side short circuit to ground fault condition is present,
sensing and identifying a low-side short circuit to battery fault condition when is present,
sensing and identifying a short circuited load fault condition when is present, and
indicating a "no fault" condition when none of the open load fault condition, the high-side short circuit to battery fault condition, the low-side short circuit to ground fault condition, the high-side short circuit to ground fault condition, the low-side short circuit to battery fault condition, and the short circuited load fault condition are present
are based on the high-side overcurrent logic signal, the low-side overcurrent logic signal, a signal from the high-side voltage comparison means, and a signal from the low-side voltage comparison means.

* * * * *